US009236532B2

(12) United States Patent
Lee et al.

(10) Patent No.: US 9,236,532 B2
(45) Date of Patent: Jan. 12, 2016

(54) LIGHT EMITTING DIODE HAVING ELECTRODE PADS

(75) Inventors: Sum Geun Lee, Ansan-si (KR); Jin Cheol Shin, Ansan-si (KR); Yeo Jin Yoon, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 228 days.

(21) Appl. No.: 13/330,327

(22) Filed: Dec. 19, 2011

(65) Prior Publication Data

US 2012/0326171 A1 Dec. 27, 2012

Related U.S. Application Data

(63) Continuation-in-part of application No. 12/963,921, filed on Dec. 9, 2010, now Pat. No. 8,541,806.

(30) Foreign Application Priority Data

Dec. 14, 2009 (KR) .......................... 10-2009-0123862
Aug. 11, 2011 (KR) .......................... 10-2011-0080232

(51) Int. Cl.
*H01L 33/38* (2010.01)
*H01L 33/62* (2010.01)
*H01L 33/20* (2010.01)
*H01L 33/44* (2010.01)

(52) U.S. Cl.
CPC .............. *H01L 33/387* (2013.01); *H01L 33/38* (2013.01); *H01L 33/62* (2013.01); *H01L 33/20* (2013.01); *H01L 33/44* (2013.01); *H01L 2924/0002* (2013.01)

(58) Field of Classification Search
CPC ....... H01L 33/38; H01L 33/387; H01L 33/44; H01L 33/62
USPC .................................................. 257/88–100
See application file for complete search history.

(56) References Cited

U.S. PATENT DOCUMENTS 6,650,018 B1  11/2003  Zhao et al.
7,417,259 B2   8/2008  Sakai et al.
(Continued)

FOREIGN PATENT DOCUMENTS

CN    101431141      5/2009
JP    2007-049160    2/2007
(Continued)

OTHER PUBLICATIONS

Notice of Allowance issued on May 24, 2013 in U.S. Appl. No. 12/963,921.
(Continued)

*Primary Examiner* — Eva Y Montalvo
*Assistant Examiner* — Nga Doan
(74) *Attorney, Agent, or Firm* — H.C. Park & Associates, PLC

(57) ABSTRACT

The present invention relates to light-emitting diodes. A light-emitting diode according to an exemplary embodiment of the present invention includes a first group including a plurality of first light emitting cells connected in parallel to each other, and a second group including a plurality of second light emitting cells connected in parallel to each other. Each first light emitting cell and second light emitting cell has a semiconductor stack that includes a first conductivity-type semiconductor layer, a second conductivity-type semiconductor layer, and an active layer disposed between the first conductivity-type semiconductor layer and the second conductivity-type semiconductor layer. At least two light emitting cells of the first light emitting cells share the first conductivity-type semiconductor layer, and at least two light emitting cells of the second light emitting cells share the first conductivity-type semiconductor layer. The first light emitting cells are connected in series to the second light emitting cells.

13 Claims, 15 Drawing Sheets

(56) References Cited

U.S. PATENT DOCUMENTS

| | | |
|---|---|---|
| 2007/0228388 A1 | 10/2007 | Ko et al. |
| 2008/0210972 A1 | 9/2008 | Ko et al. |
| 2008/0279229 A1 | 11/2008 | Suzuki et al. |
| 2011/0210352 A1* | 9/2011 | Lee et al. .................. 257/93 |

FOREIGN PATENT DOCUMENTS

| | | |
|---|---|---|
| JP | 2009-088481 | 4/2009 |
| KR | 10-0809220 | 2/2008 |
| TW | 200840089 | 10/2008 |

OTHER PUBLICATIONS

Preliminary Notice of First Office Action issued on Apr. 24, 2013 in Taiwanese Patent Application No. 099140424.

Search Report completion dated on Apr. 22, 2013 in in Taiwanese Patent Application No. 099140424.

Final Office Action issued Sep. 24, 2015 in U.S. Appl. No. 14/229,693.

* cited by examiner

LIGHT EMITTING DIODE HAVING ELECTRODE PADS

CROSS-REFERENCE TO RELATED APPLICATIONS

This application is a continuation-in-part of U.S. patent application Ser. No. 12/963,921, filed on Dec. 9, 2010, and claims priority from and the benefit of Korean Patent Application No. 10-2011-0080232, filed on Aug. 11, 2011 and Korean Patent Application No. 10-2009-0123862, filed on Dec. 14, 2009, which are all hereby incorporated by reference for all purposes as if fully set forth herein.

BACKGROUND OF THE INVENTION

1. Field of the Invention

Exemplary embodiments of the present invention relate to light-emitting diodes and to light-emitting diodes having electrode pads, and more particularly, to high voltage and/or high efficiency light-emitting diodes.

2. Discussion of the Background

Gallium nitride (GaN) based light emitting diodes (LEDs) have been used in a wide range of applications including full color LED displays, LED traffic signals, and white LEDs.

The GaN-based light emitting diode may be generally formed by growing epitaxial layers on a substrate, for example, a sapphire substrate, and includes an N-type semiconductor layer, a P-type semiconductor layer, and an active layer disposed between the N-type semiconductor layer and the P-type semiconductor layer. Further, an N electrode pad is formed on the N-type semiconductor layer and a P electrode pad is formed on the P-type semiconductor layer. The light emitting diode is electrically connected to and operated by an external power source through these electrode pads. Here, electric current is directed from the P-electrode pad to the N-electrode pad through the semiconductor layers.

Generally, since the P-type semiconductor layer may have a high resistivity, electric current may not be evenly distributed within the P-type semiconductor layer, but may be concentrated on a portion of the P-type semiconductor layer where the P-electrode pad is formed. Electric current may be concentrated on and flow through edges of the semiconductor layers. This may be referred to as current crowding, and may lead to a reduction in light emitting area, thereby deteriorating luminous efficacy of a source. A transparent electrode layer having a low resistivity may be formed on the P-type semiconductor layer to enhance current spreading. In this structure, electric current supplied from the P-electrode pad may be dispersed by the transparent electrode layer before entering the P-type semiconductor layer, thereby increasing a light emitting area of the LED.

However, since the transparent electrode layer may tend to absorb light, the is thickness of the transparent electrode layer is limited, thereby providing limited current spreading. In particular, for a large LED having an area of about 1 mm$^2$ or more, there is a limitation on current spreading through the transparent electrode layer.

To facilitate current spreading within a LED, extensions extending from the electrode pads may be used. For example, U.S. Pat. No. 6,650,018, issued to Zhao, et al. discloses an LED that includes a plurality of extensions extending in opposite directions from electrode pads to enhance current spreading. Although the use of extensions may enhance current spreading over a wide region of the LED, current crowding may still occur at portions of the LEDs where the electrode pads are formed.

Moreover, as the size of the LED increases, the likelihood of a defect being present in the light emitting diode may increase. Defects such as threading dislocations, pin-holes, etc. provide a path through which electric current may flow rapidly, thereby disturbing uniform current spreading in the LED.

A light emitting device having a plurality of light emitting cells serially connected to each other in a single chip to operate under high voltage is disclosed in U.S. Pat. No. 7,417,259, issued to Sakai, et al.

Recently, light emitting devices capable of being powered by 110 V or 220 V domestic alternating current (AC) power sources have been commercialized. In such a light emitting device, chips each having a plurality of light emitting cells serially connected to each other are mounted in a package to be serially connected to each other, and each package may be used together with a bridge rectifier. Two to four light emitting diode chips, each of which includes sixteen to twenty light emitting cells serially connected to each other on a single substrate, may be connected in series within a package to be powered by 110 V or 220 V power sources.

Particularly, assuming that each light emitting cell is powered by a forward voltage of about 3.5V, three to fifteen light emitting cells are serially connected to each other in order to provide high voltage products, such as 12V, 24V, 36V, 48V, and the like, to which a switching mode power supply (SMPS) is applied. Since a power of about 3 to 11 W may be applied to high voltage products, relatively high electric current may be supplied to each of the light emitting cells. In this case, if the light emitting cells have excessively small sizes, current density may be excessively increased, thereby deteriorating reliability. On the contrary, if the light emitting cells have excessively large sizes, electric current may not be uniformly distributed, thereby causing current crowding and deteriorating light extraction efficiency.

FIG. 7 is a schematic plan view explaining a conventional high voltage light emitting diode and FIG. 8 is a schematic circuit diagram of FIG. 7. Here, three light emitting cells are connected in series.

Referring to FIG. 7 and FIG. 8, a conventional light emitting diode includes a substrate 21, light emitting cells C1, C2, C3, a cathode 37, an anode 39, interconnecting sections 41, first electrode pads 35, and second electrode pads 33.

The light emitting cells C1, C2, C3 are separated from each other on the substrate 21 and each includes a first conductive type semiconductor layer 23, an active layer (not shown), and a second conductive type semiconductor layer 27. Here, the first conductive type semiconductor layer 23 is an n-type semiconductor layer, and the second conductive type semiconductor layer 27 is a p-type semiconductor layer. In the light emitting cells C1, C2, C3, the first conductive type semiconductor layers 27 are separated from each other, so that each of the light emitting cells C1, C2, C3 constitutes each unit U1, U2, U3. A transparent electrode layer (not shown) may be placed on the second conductive type semiconductor layer 27.

The cathode 37 is placed on the first conductive type semiconductor layer 23 of each of the light emitting cells Cl, C2, C3, and the anode 39 is also placed on the second conductive type semiconductor layer 27 of each of the light emitting cells Cl, C2, C3. The cathodes 37 and the anodes 39 may be distributed in alternate arrangement over a wide area for current spreading.

Meanwhile, in adjacent light emitting cells, the cathode 37 is serially connected to the anode 39 via the interconnecting section 41. Accordingly, as shown in FIG. 8, it is possible to provide a light emitting diode having three serially connected light emitting cells and powered by, for example, a 12V power source.

In this light emitting diode, two first electrode pads 35 and two second electrode pads 33 are provided for current spreading, and the anode 39 and cathode 37 extend on each of the light emitting cells C1, C2, C3.

However, since the anode 39 and the cathode 37 are formed to relatively large sizes in order to obtain uniform current spreading on a large scale chip having, for example, a size of 1 mm×1 mm or more, optical loss inevitably occurs due to the anode and cathode 37, 39. Furthermore, since a relatively long anode 39 is placed on a single light emitting cell, current crowding is likely to occur near the second electrode pads 33. Moreover, since each light emitting cell has a relatively large light emitting area, light extraction efficiency is further deteriorated due to low current density.

On the other hand, for a light emitting diode in which a relatively large number of light emitting cells, for example, 15 light emitting cells, are serially connected in each of chips having the same size, the light emitting cells have small sizes so that current density increases in the light emitting cells, thereby deteriorating reliability.

SUMMARY OF THE INVENTION

Exemplary embodiments of the present invention provide a light emitting diode which ensures uniform current spreading in light emitting cells.

Exemplary embodiments of the present invention also provide a light emitting diode capable of improving light extraction efficiency of each light emitting cell.

Exemplary embodiments of the present invention also provide a light emitting diode having high reliability.

Exemplary embodiments of the invention also provide a light emitting diode with high integration of light emitting cells.

Additional features of the invention will be set forth in the description which follows, and in part will be apparent from the description, or may be learned by practice of the invention.

An exemplary embodiment of the present invention discloses a light emitting diode including a first group including a plurality of first light emitting cells connected in parallel to each other, and a second group including a plurality of second light emitting cells connected in parallel to each other. Each of the first and second light emitting cells has a semiconductor stack which includes a first conductivity-type semiconductor layer, a second conductivity-type semiconductor layer, and an active layer disposed between the first conductivity-type semiconductor layer and the second conductivity-type semiconductor layer. At least two light emitting cells of the first light emitting cells share the first conductivity-type semiconductor layer, and at least two light emitting cells of the second light emitting cells share the first conductivity-type semiconductor layer. The first light emitting cells are connected in series to the second light emitting cells.

An exemplary embodiment of the present invention also discloses a light emitting diode including a first group of first light emitting cells including a plurality of pairs of first light emitting cells, the light emitting cells in each pair facing each other, a first common cathode line connected to each pair of first light emitting cells, and first anode lines respectively connected to the first light emitting cells at a first side and a second side in each pair of first light emitting cells. Each of the first light emitting cells includes a first conductivity-type semiconductor layer, an active layer, and a second conductivity-type semiconductor layer, and each pair of first light emitting cells shares the first conductivity-type semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
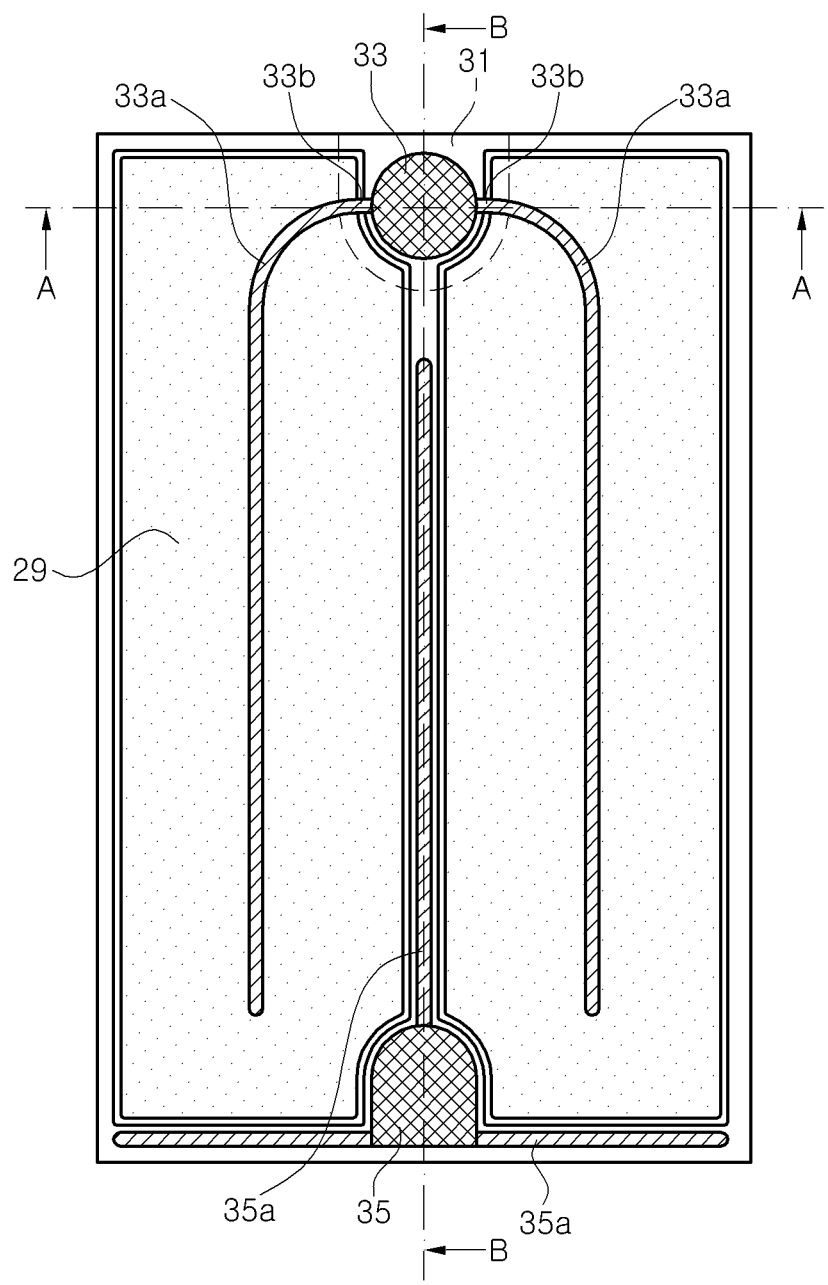
FIG. 1 is a plan view of a light emitting diode according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
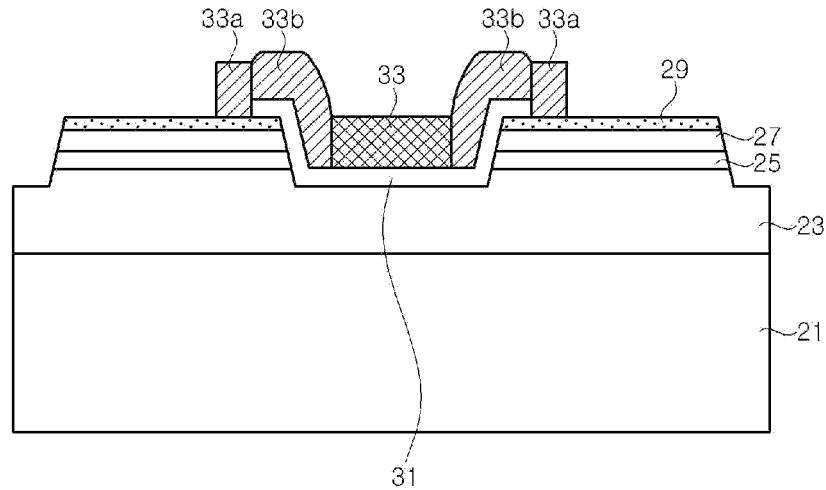
FIG. 2 is a cross-sectional view taken along line A-A of FIG. 1.
Figure 3:
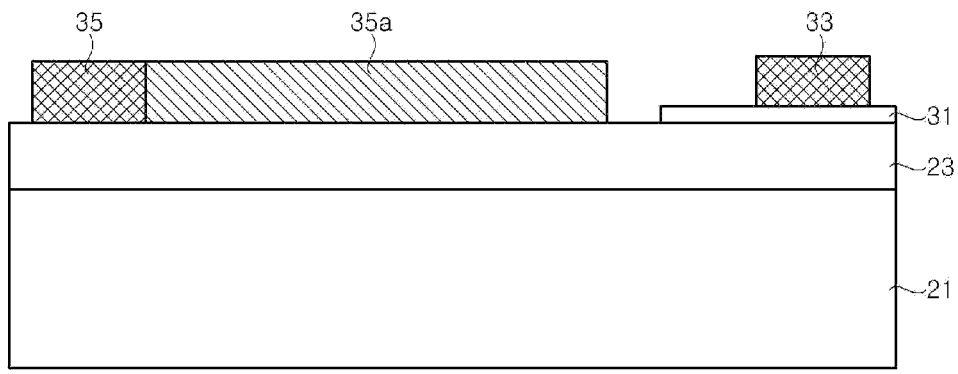
FIG. 3 is a cross-sectional view taken along line B-B of FIG. 1.

FIG. 1 is a plan view of a light emitting diode according to an exemplary embodiment of the present invention, FIG. 2 is a cross-sectional view taken along line A-A of FIG. 1, and FIG. 3 is a cross-sectional view taken along line B-B of FIG. 1.

Referring to FIG. 1, FIG. 2, and FIG. 3, the light emitting diode includes a substrate 21, a first conductive type semiconductor layer 23, an active layer 25, a second conductive type semiconductor layer 27, an insulation layer 31, first electrode pad 35, second electrode pad 33, and upper extensions 33a. The light emitting diode may further include connecting portions 33b, a transparent electrode layer 29, and lower extensions 35a. The substrate 11 may be a sapphire substrate, but is not limited thereto.

The first conductive type semiconductor layer 23 is located on the substrate 21 and the second conductive type semiconductor layer 27 is located on the first conductive type semiconductor layer 23 with the active layer 25 disposed between the first and second conductive type semiconductor layers 23 and 27. The first conductive type semiconductor layer 23, active layer 25, and second conductive type semiconductor layer 27 may be formed of, but are not limited to, a GaN-based compound semiconductor material such as (Al, In, Ga)N. The constituent elements and composition of the active layer 25 are determined to emit light having a desired wavelength, for example, ultraviolet or blue light. The first conductive type semiconductor layer 23 may be an n-type nitride semiconductor layer and the second conductive type semiconductor layer 27 may be a p-type nitride semiconductor layer, or vice versa.

The first conductive type semiconductor layer 23 and/or the second conductive type semiconductor layer 27 may have a single layer structure, or alternatively, a multilayer structure. Further, the active layer 25 may have a single quantum well structure or a multi-quantum well structure. The light emitting diode may further include a buffer layer (not shown) disposed between the substrate 21 and the first conductive type semiconductor layer 23. These first conductive type semiconductor layer 23, the active layer 25, and the second conductive type semiconductor layer 27 may be formed by a metal-organic chemical vapor deposition (MOCVD) technique or molecular beam epitaxy (MBE) technique.

A transparent electrode layer 29 may be formed on the second conductive type semiconductor layer 27. The transparent electrode layer 29 may be formed of indium tin oxide (ITO) or Ni/Au, and form an ohmic contact with the second conductive type semiconductor layer 27.

The second conductive type semiconductor layer 27 and the active layer 25 may be subjected to a process to expose a region(s) of the first conductive type semiconductor layer 23 via photolithography and etching. Such a process is generally known as a mesa-etching. The mesa etching may provide divided light emitting regions as shown in FIG. 1 and FIG. 2. Although, in the present exemplary embodiment, the light emitting diode has two light emitting regions that are isolated from each other, the light emitting diode may have more than two separate light emitting regions. Further, the mesa-etching may be performed to form inclined side surfaces which have a degree of inclination in the range of 30-70 degrees.

The first electrode pad 35 and the second electrode pad 33 are located on the first conductive type semiconductor layer 23, which is exposed through the mesa etching. The first electrode pad 35 is electrically connected to the first conductive type semiconductor layer 23. The second electrode pad 33 is insulated from the first conductive type semiconductor layer 23 by the insulation layer 31. The first electrode pad 35 and the second electrode pad 33 are bonding pads for bonding wires and may have an area sufficiently wide for wire bonding. The first electrode pad 35 and the second electrode pad 33 may be formed on the exposed region(s) of the first conductive type semiconductor layer 23, but are not limited thereto.

The insulation layer 31 is disposed between the second electrode pad 33 and the first conductive type semiconductor layer 23 to insulate the second electrode pad 33 from the first conductive type semiconductor layer 23. Further, the insulation layer 31 may cover the side surfaces of the second conductive type semiconductor layer 27 and the active layer 25, which are exposed by the mesa etching. The insulation layer 31 may extend to an upper surface of the second conductive type semiconductor layer 27 such that an edge of the insulation layer 31 overlaps the second conductive type semiconductor layer 27 or the transparent electrode layer 29. The insulation layer 31 may be a single layer structure (as shown in the Figures), or a multilayered structure. The insulation layer 31 may include, for example, $SiO_2$ and/or $Si_3N_4$. Alternatively, the insulation layer 31 may be a multilayered dielectric reflector (such as a distributed Bragg reflector), including alternately stacked layers of $SiO_2$ and $TiO_2$. The multilayered dielectric reflector can reflect light incident on the second electrode pad 33, thus decreasing light absorption by the second electrode pad 33.

The upper extensions 33a are located on the second conductive type semiconductor layer 27 (or transparent electrode layer 29). The upper extensions 33a may be connected to the second electrode pad 33 via connecting portions 33b, respectively, and may be electrically connected to the second conductive type semiconductor layer 27. The upper extensions 33a are disposed to allow uniform current spreading on the second conductive type semiconductor layer 27. The connecting portions 33b are separated from the side surfaces of the transparent electrode layer 29, the second conductive type semiconductor layer 27, and the active layer 25 by the insulation layer 31.

At least one lower extension 35a may extend from the first electrode pad 35. The lower extension 35a is located on the first conductive type semiconductor layer 23 and electrically connected thereto. As shown in the figures, the lower extension 35a may be located between the divided light emitting regions, but is not limited thereto. Alternatively, the lower extension 35a may be located outside the light emitting regions.

As shown in the present exemplary embodiment as well as the following exemplary embodiments, the lower extension 35a and the upper extension 33a may be arranged in specific patterns to help improve current spreading. For example, in the present exemplary embodiment, having two upper extensions 33a extend from the second electrode pad 33 along each of the divided light emitting regions may improve current spreading while not requiring multiple electrode pads on the light emitting diode to connect to the upper extensions 33a. In the various exemplary embodiments, the lower extension and upper extension arrangement may likewise improve current spreading in divided light emitting regions while avoiding a requirement for multiple electrode pads on the single substrate.

The second electrode pad 33, the first electrode pad 35, the upper extensions 33a, the connecting portions 33b, and the lower extension 35a may be formed of, but are not limited to, the same material, for example, Cr/Au by the same process.

Alternatively, the upper extensions 33a and the second electrode pad 33 may be formed of different materials by different processes.

In the present exemplary embodiment, the divided light emitting regions have a symmetrical structure relative to a line, for example, a cut line B-B, which is located between the first electrode pad 35 and the second electrode pad 33. The upper extensions 33a are also disposed in a symmetrical structure, so that the light emitting regions may exhibit the same radiation characteristics. Accordingly, when a light emitting region is divided into two light emitting regions in a single light emitting diode, a process of packaging the light emitting diode may be further simplified compared to using two light emitting diodes connected in parallel to each other. Furthermore, the divided light emitting regions may relieve current crowding caused by defects and may improve light extraction efficiency through formation of the inclined side surfaces by mesa etching.

Figure 4:
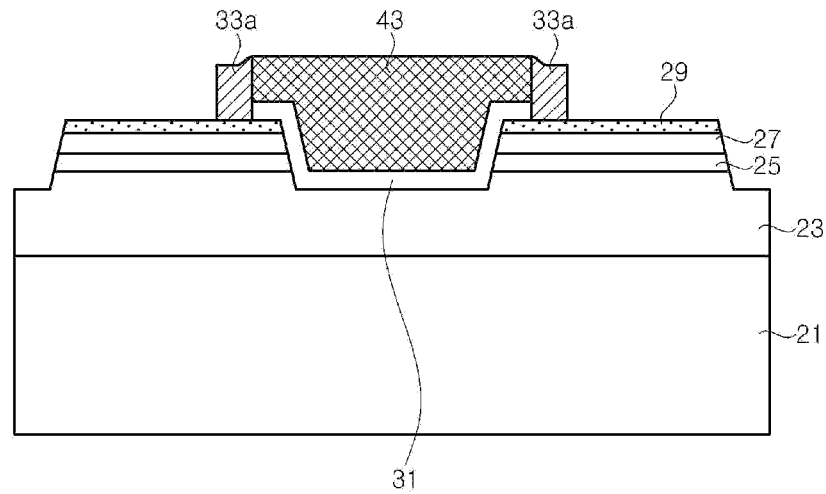
FIG. 4 is a cross-sectional view of a light emitting diode according to an exemplary embodiment of the present invention.

FIG. 4 shows a cross-sectional view of a light emitting diode according to an exemplary embodiment of the present invention.

Referring to FIG. 4, the light emitting diode of the present exemplary embodiment is generally similar to the light emitting diode described with reference to FIG. 1, FIG. 2, and FIG. 3. In the light emitting diode of the present exemplary embodiment, however, a portion of a second electrode pad 43 is located on a second conductive type semiconductor layer 27.

Specifically, the second electrode pad 43 is located on a first conductive type semiconductor layer 23 exposed through a mesa etching process and a portion of the second electrode pad 43 is located on the second conductive type semiconductor layer 27. The second electrode pad 43 is insulated not only from the first conductive type semiconductor layer 23 but also from the transparent electrode layer 29, the second conductive type semiconductor layer 27, and the active layer 25 by an insulation layer 31. Extensions 33a extend from the second electrode pad 43.

In the present exemplary embodiment, the second electrode pad 43 is separated from the semiconductor layers by the insulation layer 31, which may thereby prevent current crowding around the second electrode pad 43. Furthermore, in the present exemplary embodiment, an area subjected to mesa etching may be decreased compared to the previous exemplary embodiment, thereby increasing the light emitting region.

Figure 5:
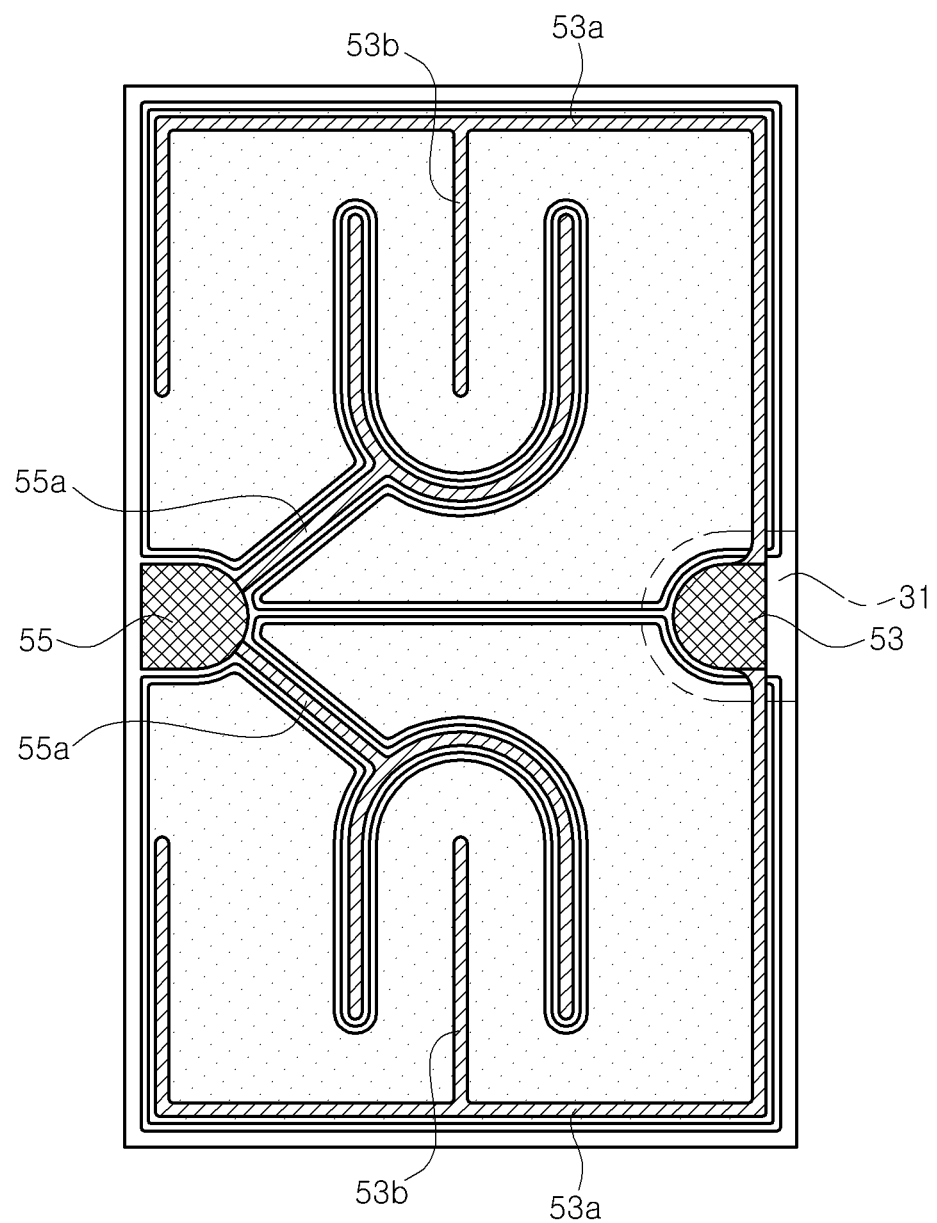
FIG. 5 is a plan view of a light emitting diode according to an exemplary embodiment of the present invention.

FIG. 5 is a plan view of a light emitting diode according to an exemplary embodiment of the present invention.

In the exemplary embodiment shown in FIG. 1, the first electrode pad 35 and the second electrode pad 33 are disposed along a major axis of the light emitting diode, and the light emitting regions are divided from each other along the major axis of the light emitting diode. On the contrary, the light emitting diode according to the present exemplary embodiment includes a first electrode pad 55 and a second electrode pads 53 disposed along a minor axis of the light emitting diode and light emitting regions divided from each other along the minor axis of the light emitting diode. Further, the divided light emitting regions are disposed in a symmetrical structure and upper extensions 53a and lower extensions 55a are also disposed in a symmetrical structure.

In the present exemplary embodiment, the upper extensions 53a extend along a periphery of the light emitting diode to surround the light emitting diode, and each of the upper extensions 53a has an extension 53b extending inward from the periphery of the light emitting diode. The lower extensions 55a extend from an inner side of the light emitting diode toward the outside of the light emitting diode. Each of the lower extensions 55a may be bifurcated to surround an extension 53b in each light emitting region. In the present exemplary embodiment, the ends of lower extensions 55a have a shape which resembles a "U", but is not limited thereto.

Figure 6:
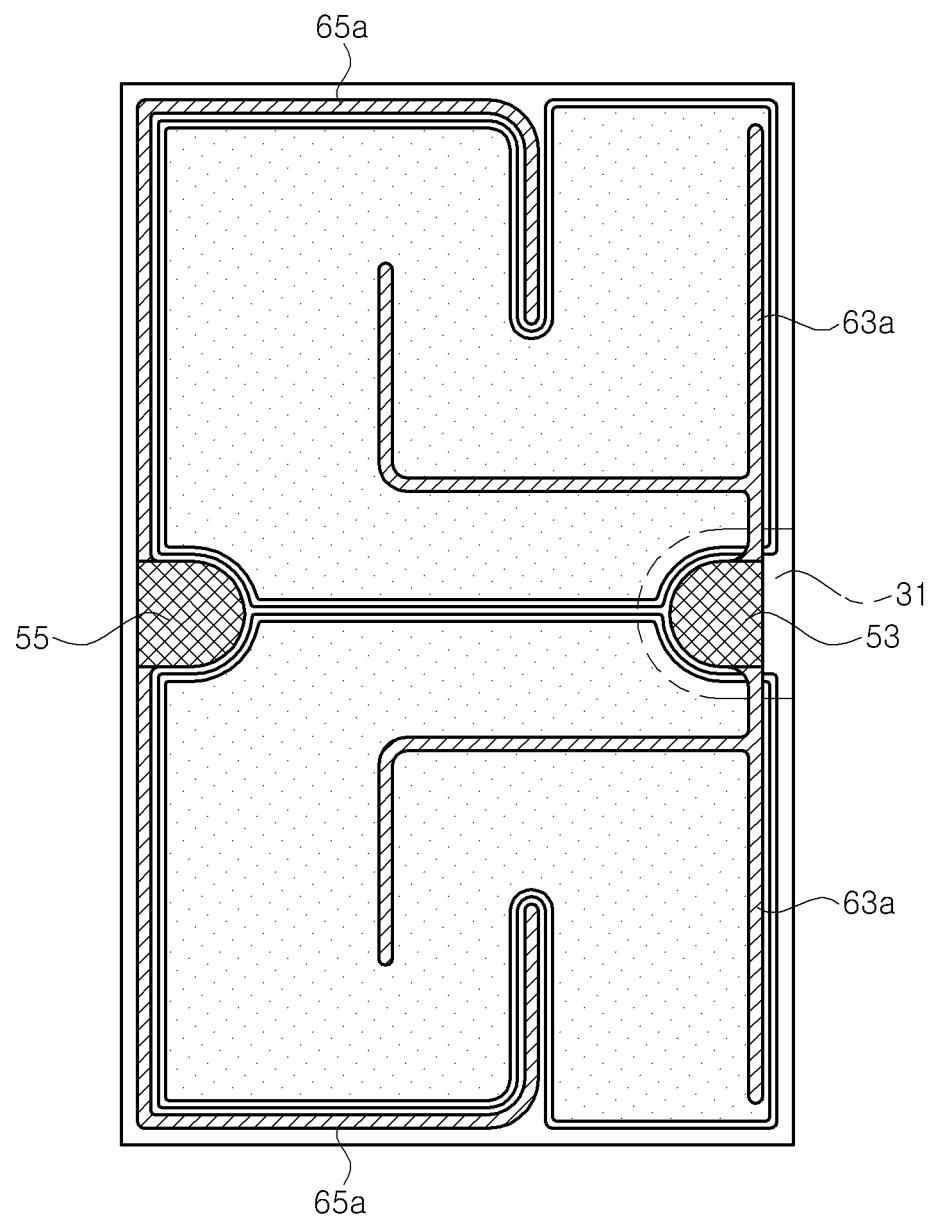
FIG. 6 is a plan view of a light emitting diode according to an exemplary embodiment of the present invention.
Figure 7:
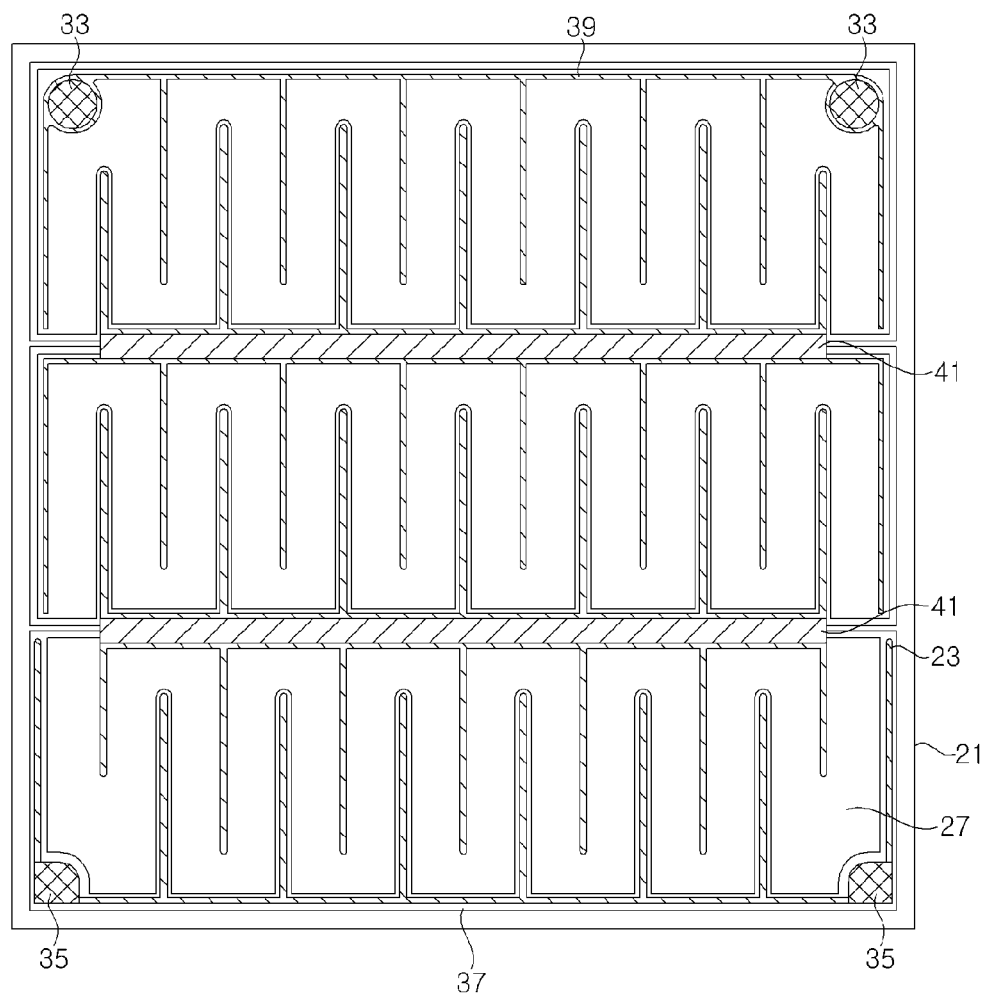
FIG. 7 is a schematic plan view of a conventional light emitting diode.
Figure 8:
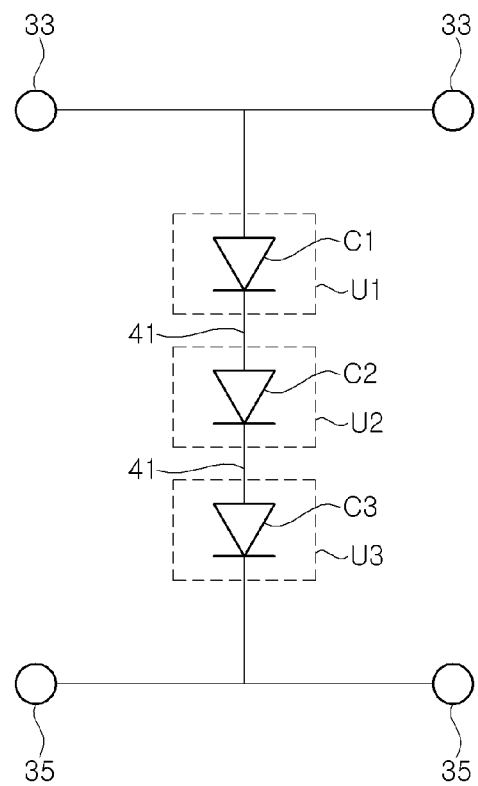
FIG. 8 is a circuit diagram of FIG. 7.

FIG. 6 is a plan view of a light emitting diode according to an exemplary embodiment of the present invention.

Referring to FIG. 6, the light emitting diode of the present exemplary embodiment is generally similar to the light emitting diode described with reference to FIG. 5. In the light emitting diode of the present exemplary embodiment, however, lower extensions 65a and upper extensions 63a have different arrangements than the upper extensions 53a and lower extensions 55a.

Specifically, the lower extensions 65a extend along a periphery of the light emitting diode first and then extend into the light emitting regions, and each of the upper extensions 63a includes two extension portions disposed on one of the light emitting regions, and these two extension portions surround the lower extension 65a extending into the light emitting region. That is, in the present exemplary embodiment, a first portion of each upper extension 63a extends along a periphery of the light emitting region, and a second portion of each upper extension 63a extends into the light emitting region after branching off from the first portion of the upper extension 63a. A part of the second portion of the upper extension 63a extending into the light emitting region is substantially perpendicular to the lower extension 65a extending into the light emitting region, and another part of the second portion of the upper extension 63a extending into the light emitting region is substantially parallel to the lower extension 65a extending into the light emitting region. Therefore, the two portions of the upper extension 63a may be referred to as surrounding the lower extension 65a extending into the light emitting region. This arrangement may improve current spreading in the divided light emitting regions in the light emitting diode.

Although exemplary embodiments are described above to illustrate the present invention, the light emitting diode is described as being divided into two light emitting regions, but alternative embodiments may have the light emitting diode being divided into more than two light emitting regions. In some embodiments, the light emitting regions may not be completely divided from each other. In other words, portions of the light emitting regions may be connected to each other.

Figure 9:
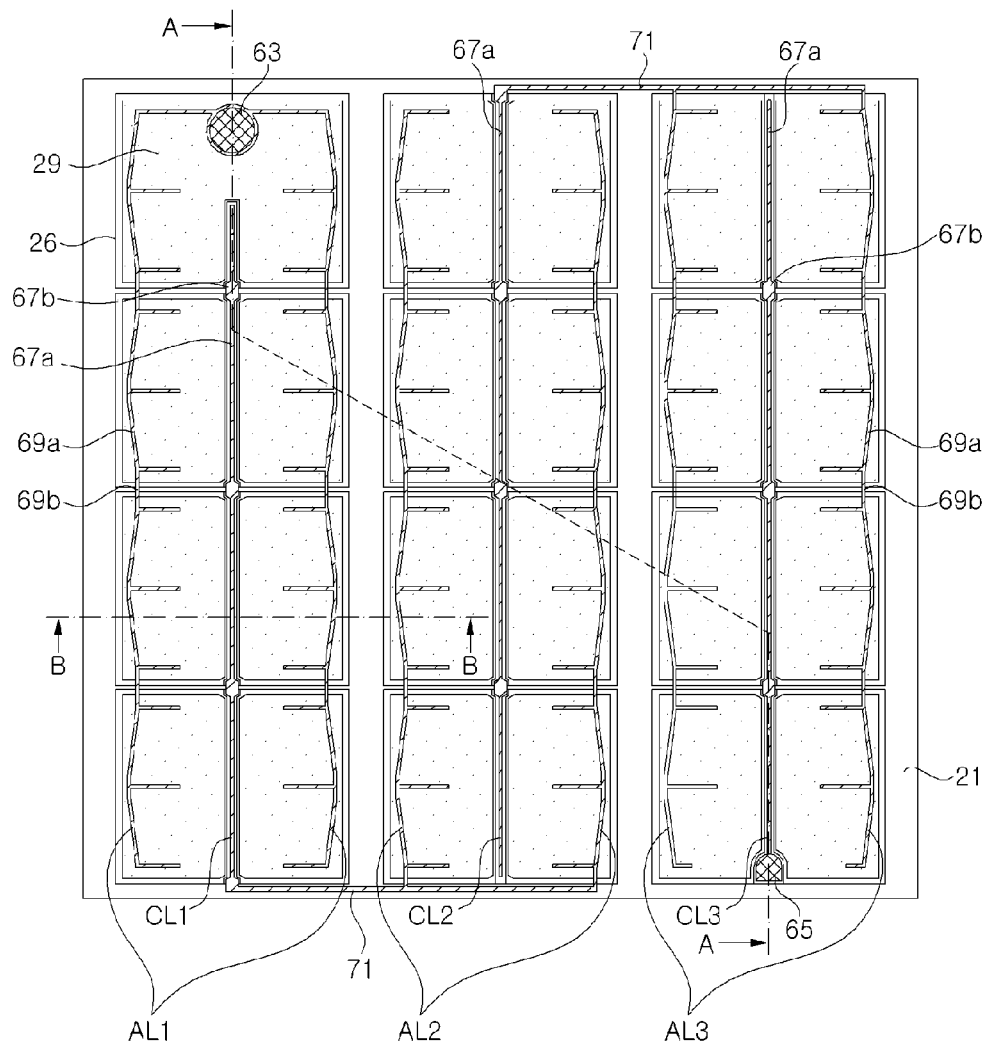
FIG. 9 is a schematic plan view of a light emitting diode in accordance with an exemplary embodiment of the present invention.
Figure 10:
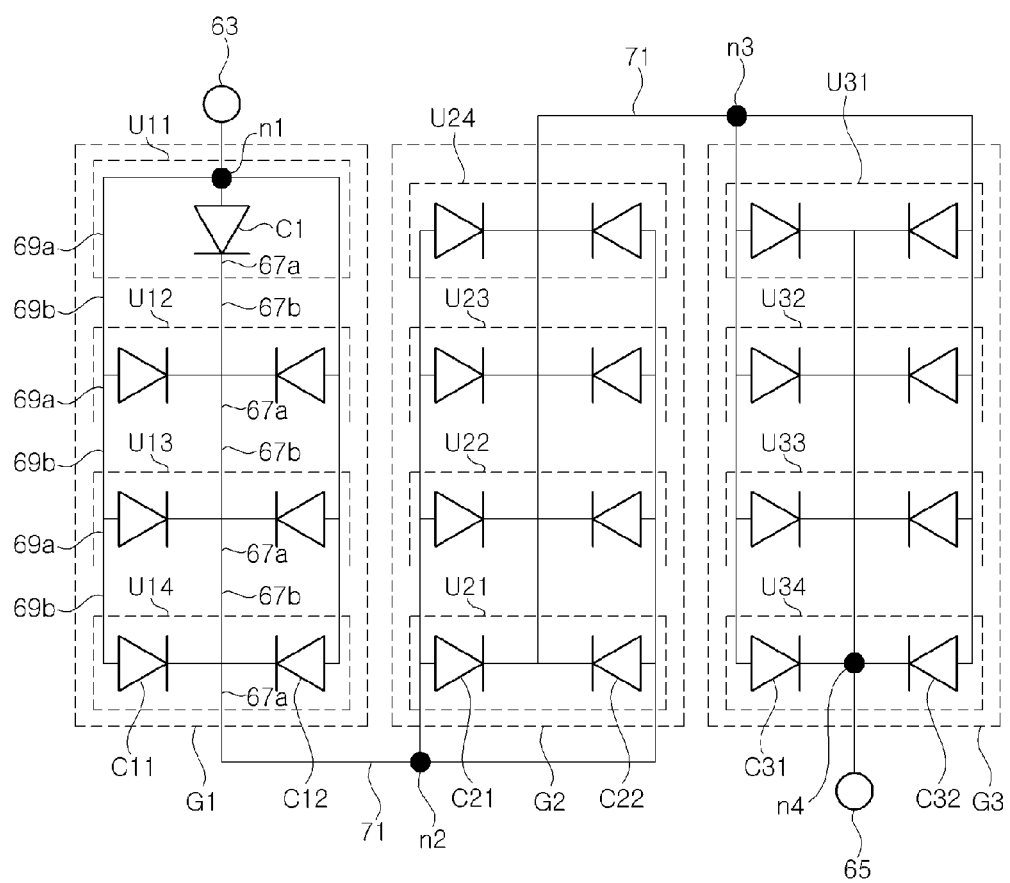
FIG. 10 is a circuit diagram of FIG. 9.
Figure 11A:
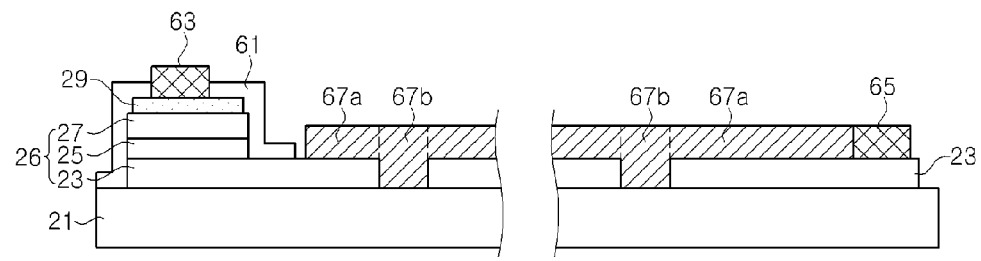
FIG. 11a and FIG. 11b are sectional views taken along lines A-A and B-B of FIG. 9.
Figure 11B:
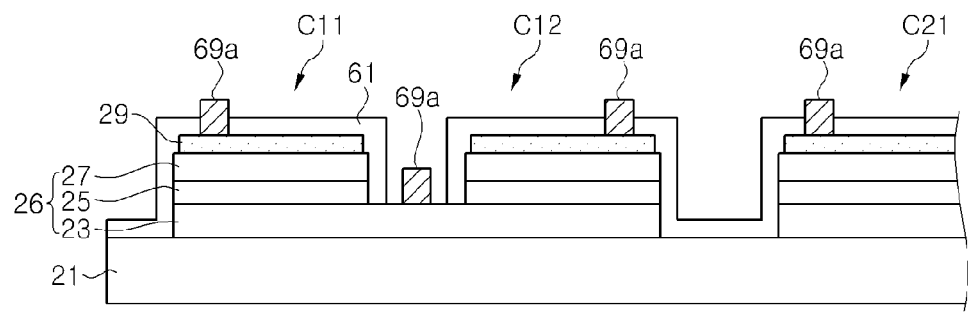

FIG. 9 is a schematic plan view of a light emitting diode in accordance with an exemplary embodiment of the present invention, FIG. 10 is a circuit diagram of FIG. 9, and FIG. 11a and FIG. 11b are sectional views taken along lines A-A and B-B of FIG. 9.

Referring to FIG. 9, FIG. 10, FIG. 11a, and FIG. 11b, the light emitting diode according to the present exemplary embodiment includes a substrate 21, a plurality of light emitting cells 26, first to third common electrode lines CL1, CL2, CL3, first to third electrode lines AL1, AL2, AL3, interconnecting sections 71, a first electrode pad 65, and a second electrode pad 63. Further, a transparent electrode layer 29 may be placed on each of the light emitting cells 26, and an insulating layer 61 may be formed on upper and lateral sides of each of the light emitting cells 26.

The substrate 21 supports the light emitting cells 26, and may be a growth substrate for growing semiconductor layers, which includes, but is not limited to, a sapphire substrate, a silicon substrate, and a GaN substrate. Typically, the substrate 21 refers to a substrate in a light emitting diode chip. However, when there is no substantial substrate within a chip, the substrate 21 refers to a substrate which directly supports a light emitting structure.

The plurality of light emitting cells 26 is placed on the substrate 21. As shown in FIG. 11*a* and FIG. 11*b*, each of the light emitting cells 26 includes a first conductive type semiconductor layer 23, an active layer 25, and a second conductive type semiconductor layer 27. In the present exemplary embodiment, the first conductive type semiconductor layer 23 is an n-type semiconductor layer and the second conductive type semiconductor layer 27 is a p-type semiconductor layer. Alternatively, the first conductive type semiconductor layer 23 may be a p-type semiconductor layer and the second conductive type semiconductor layer 27 may be an n-type semiconductor layer. The active layer 25 is located between the first conductive type semiconductor layer 23 and the second conductive type semiconductor layer 27 and may have a single quantum well structure or multi-quantum well structure. The active layer 25 may be formed of a material having a composition depending on desired wavelengths. For example, the active layer 25 may be formed of an AlInGaN-based compound semiconductor, for example, InGaN. On the other hand, the first and second conductive type semiconductor layer 23, 27 may include an AlInGaN-based compound semiconductor, for example, GaN, which has a greater energy band gap than that of the active layer 25. A buffer layer (not shown) may be interposed between the first conductive type semiconductor layer 23 and the substrate 21.

The first conductive type semiconductor layer 23, active layer 25 and second conductive type semiconductor layer 27 may be grown on the substrate 21 by metal organic chemical vapor deposition, followed by patterning through photolithography and etching.

Referring again to FIG. 9 and FIG. 10, the light emitting cells 26 are regularly arranged on the substrate 21. Here, each pair of light emitting cells is constituted by the light emitting cells disposed to face each other except for the light emitting cell C1 to which a second electrode pad 63 is connected, and each pair of light emitting cells shares the first conductive type semiconductor layer 23. For example, a first row on which the second electrode pad 63 is placed includes pairs of first light emitting cells C11 and C12 disposed to face each other, a second row includes pairs of second light emitting cells C21 and C22 disposed to face each other, and a third row includes pairs of third light emitting cells C31 and C32 disposed to face each other.

As such, each of the rows includes plural pairs of light emitting cells. On the other hand, the light emitting cell C1 is provided as a single light emitting cell in order to provide space for the second electrode pad 63 instead of constituting a pair with another light emitting cell. In FIG. 10, U11~U14, U21~U24 and U31~U34 indicate the light emitting cells for the respective first conductive type semiconductor layers 23 separated from each other in each row. The first conductive type semiconductor layers 23 may be separated from each other not only between the rows but also within in each row.

The first, second and third common electrode lines CL1, CL2, CL3 are commonly connected to the first conductive type semiconductor layers 23 of the light emitting cells 26 in the first, second and third rows, respectively. If the first conductive type semiconductor layer 23 is an n-type semiconductor, the common electrode lines CL1, CL2, CL3 are cathode lines. Each of the first, second and third common electrode lines CL1, CL2, CL3 may include an electrode 67*a* connected to the first conductive type semiconductor layer 23 and a connecting section 67*b* which connect the electrodes 67*a* to each other.

Further, the first common electrode line CL1 may be placed between the pair of first light emitting cells C11 and C12, the second common electrode line CL2 may be placed between the pair of second light emitting cells C21 and C22, and the third common electrode line CL3 may be placed between the pair of third light emitting cells C31 and C32. In other words, the first light emitting cells C11 and C12 may be disposed to face each other with respect to the first common electrode line CL1, and the second light emitting cells C21 and C22 may be disposed to face each other with respect to the second common electrode line CL2. Further, the third light emitting cells C31 and C32 may be disposed to face each other with respect to the third common electrode line CL3.

Also, first electrode lines AL1 electrically connect the first light emitting cells C11 and the first light emitting cells C12 to each other at both sides of the first common electrode line CL1, second electrode lines AL2 electrically connect the second light emitting cells C21 and the second light emitting cells C22 to each other at both sides of the second common electrode line CL1, third electrode lines AL3 electrically connect the third light emitting cells C31 and the third light emitting cells C32 to each other at both sides of the third common electrode line CL3. Each of the electrode lines AL1, AL2, AL3 may include an electrode 69*a* connected to the second conductive type semiconductor layer 27 in each of the light emitting cells 26 and a connecting section 69*b* which connects the electrodes 69*a* to each other. When the second conductive type semiconductor layers 27 are p-type semiconductors, the electrode lines AL1, AL2, AL3 are anode lines.

Ends of the first electrode lines AL1 are connected to the second electrode pad 63. On the other hand, the first common electrode line CL1 is connected to the second electrode lines AL2 via an interconnecting section 71, and the second common electrode line CL2 is connected to the third electrode lines AL3 via an interconnecting section 71. The third common electrode line CL3 is connected at one end thereof to the first electrode pad 65.

Accordingly, as shown in FIG. 10, a first group G1 includes the light emitting cells C1, C11, C12 connected in parallel to each other between a first node n1 and a second node n2, a second group G2 includes the light emitting cells C21, C22 connected in parallel to each other between the second node n2 and a third node n3, a third group G3 includes the light emitting cells C31, C32 connected in parallel to each other between the third node n3 and a fourth node n4. Further, the light emitting cells C1, C11, C12 in the first group G1 are connected in series to the light emitting cells C21, C22 in the second group G2 through the second node n2, and the light emitting cells C21, C22 in the second group G2 are connected in series to the light emitting cells C31, C32 in the third group G3.

During operation, electric current flows into the second electrode pad 63 and then flows to the first electrode pad 65 through the first, second and third nodes n1, n2, n3, so that all of the first to third light emitting cells 26 are operated.

Referring again to FIG. 11*a* and FIG. 11*b*, a transparent electrode layer 29 may be formed on each of the light emitting cells 26, and the electrodes 69*a* may be placed on the transparent electrode layer 29 to be connected to the second conductive type semiconductor layers 27. Further, an insulating layer 61 may cover upper and lateral sides of each of the light emitting cells 26. The insulating layer 61 may be formed with openings through which the first electrode pad 65 and the electrodes 69*a* can be connected to the transparent electrode layer 29. Further, the insulating layer 61 may have openings which expose the first conductive type semiconductor layers 23 such that the electrodes 67*a* can be connected to the first conductive type semiconductor layers 23. The connecting sections 69b are insulated from the lateral sides of the light emitting cells 26 by the insulating layer 61.

According to the present exemplary embodiment, it is possible to provide high integration of light emitting cells in a small chip using the light emitting cells C11 and C12; C21 and C22; C31 and C32, which share the first conductive type semiconductor layer 23. In addition, it is possible to provide a simple chip structure by arranging light emitting cells to be connected in parallel to each other in each row. Further, it is possible to ensure uniform current spreading by reducing the length of electrodes in the light emitting cells.

Although the present exemplary embodiment is illustrated as including three rows each having pairs of light emitting cells, the number of rows may be increased or decreased to control voltage to be applied to the respective light emitting cells depending on available voltage. Further, although the present exemplary embodiment is also illustrated as including seven or eight light emitting cells 26 connected in parallel to each other, the number of pairs in each row may be increased or decreased depending upon operation current to adjust the number of light emitting cells connected in parallel to each other. Accordingly, it is possible to secure optimal light extraction efficiency by controlling current density of the respective light emitting cells 26.

On the other hand, although the present exemplary embodiment is illustrated as including the light emitting cells 26 connected in parallel to each other in each row, the invention is not limited thereto. For example, some of the light emitting cells in each row may be connected in parallel to each other, and the light emitting cells in two different rows may be connected in parallel to each other.

Figure 12:
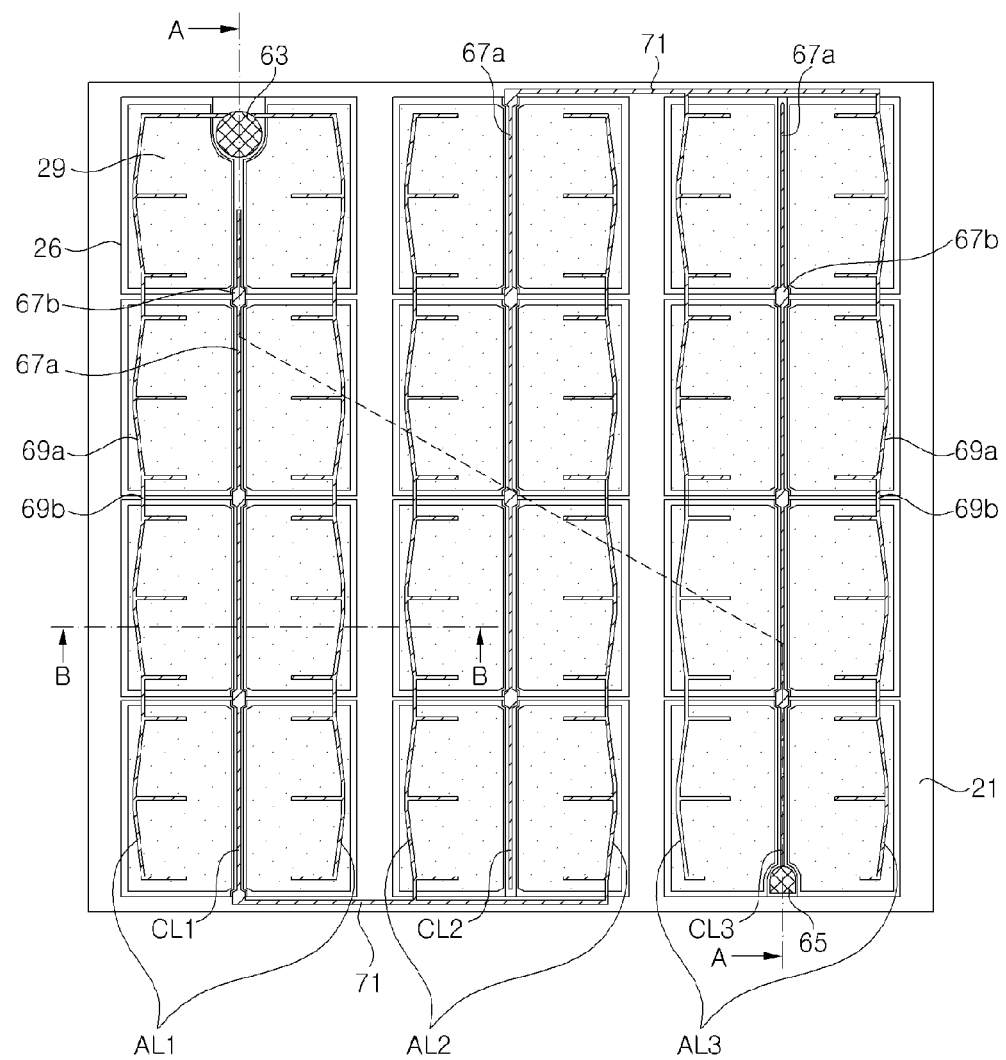
FIG. 12 is a schematic plan view of a light emitting diode in accordance with an exemplary embodiment of the present invention.
Figure 13:
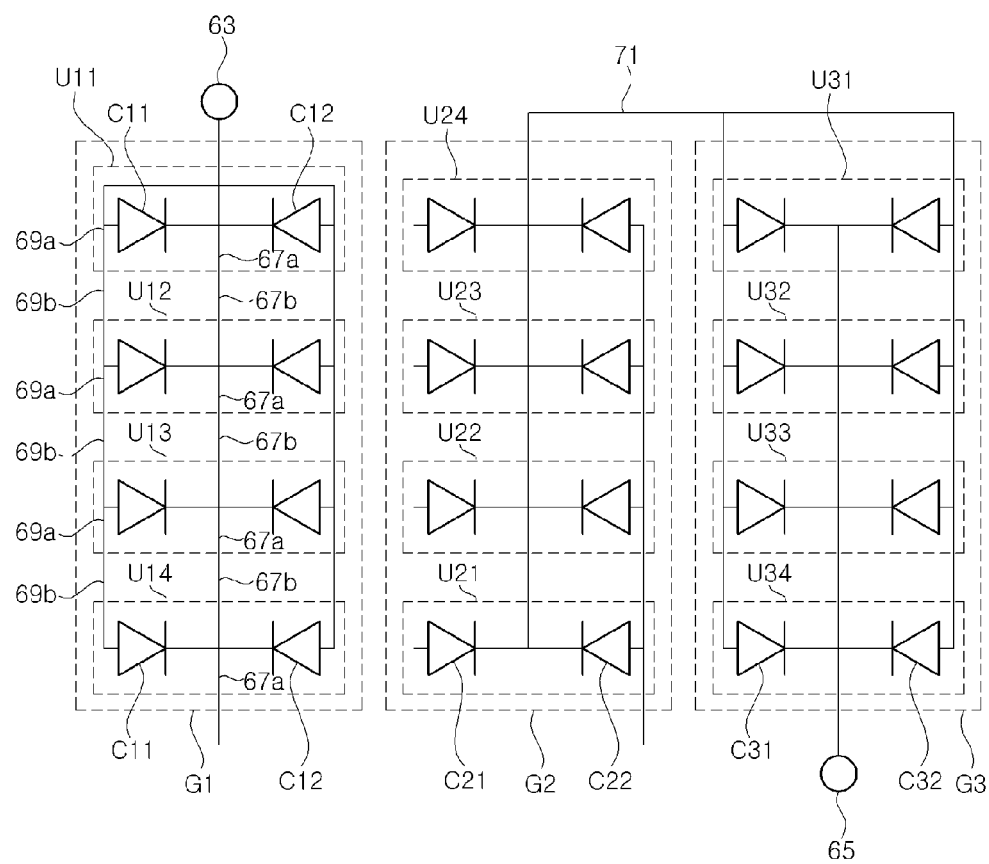
FIG. 13 is a circuit diagram of FIG. 12.
Figure 14A:
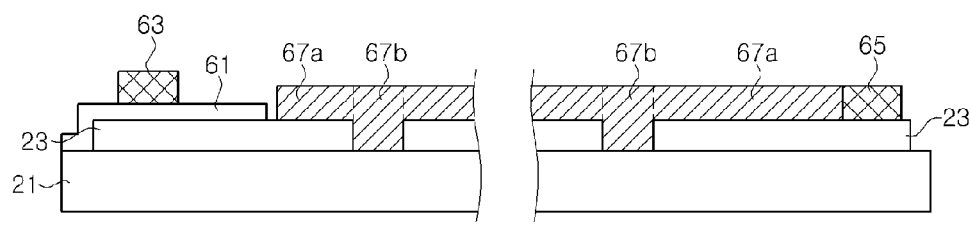
FIG. 14a and FIG. 14b are sectional views taken along lines A-A and B-B of FIG. 12.
Figure 14B:
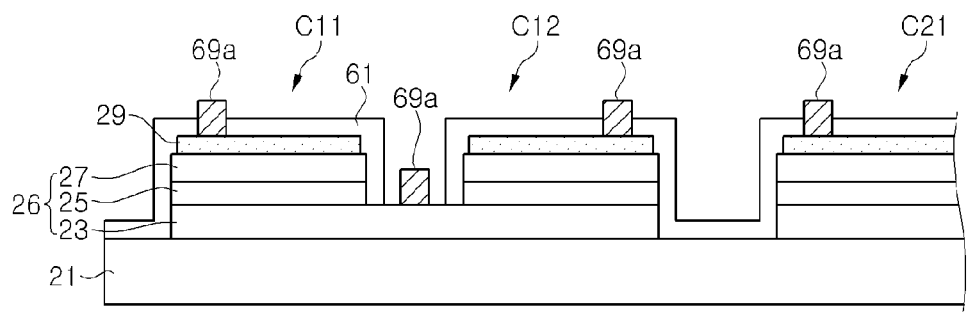

FIG. 12 is a schematic plan view of a light emitting diode in accordance with an exemplary embodiment of the present invention, FIG. 13 is a circuit diagram of FIG. 12, and FIG. 14a and FIG. 14b are sectional views taken along lines A-A and B-B of FIG. 12.

Referring to FIG. 12, FIG. 13, FIG. 14a and FIG. 14b, the light emitting diode according to the present exemplary embodiment is generally similar to the light emitting diode described with reference to FIG. 10 and FIG. 11. In the present exemplary embodiment, however, light emitting cells 26 to which a second electrode pad 63 is connected are also provided as a pair.

Specifically, in the exemplary embodiment shown in FIG. 10, the second electrode pad 63 is connected to a single light emitting cell C1, instead of being connected to a pair of light emitting cells C1, unlike the first light emitting cells C11, C12. On the contrary, in the exemplary embodiment shown in FIG. 12, a second electrode pad 63 is connected to a pair of first light emitting cells disposed to face each other and sharing a first conductive type semiconductor layer 23. In the present exemplary embodiment, the second electrode pad 63 is formed above the first conductive type semiconductor layer 23 and is also placed on an insulating layer 61 to be insulated from the first conductive type semiconductor layer 23 by the insulating layer 61, as shown in FIG. 14a.

FIG. 14b is a sectional view taken along line B-B of FIG. 12 and corresponds to FIG. 11b.

According to the present exemplary embodiment, each group may include the same number of light emitting cells 26 connected in parallel to each other, thereby making it possible to control the same electric current to be applied to the light emitting cells 26.

Figure 15:
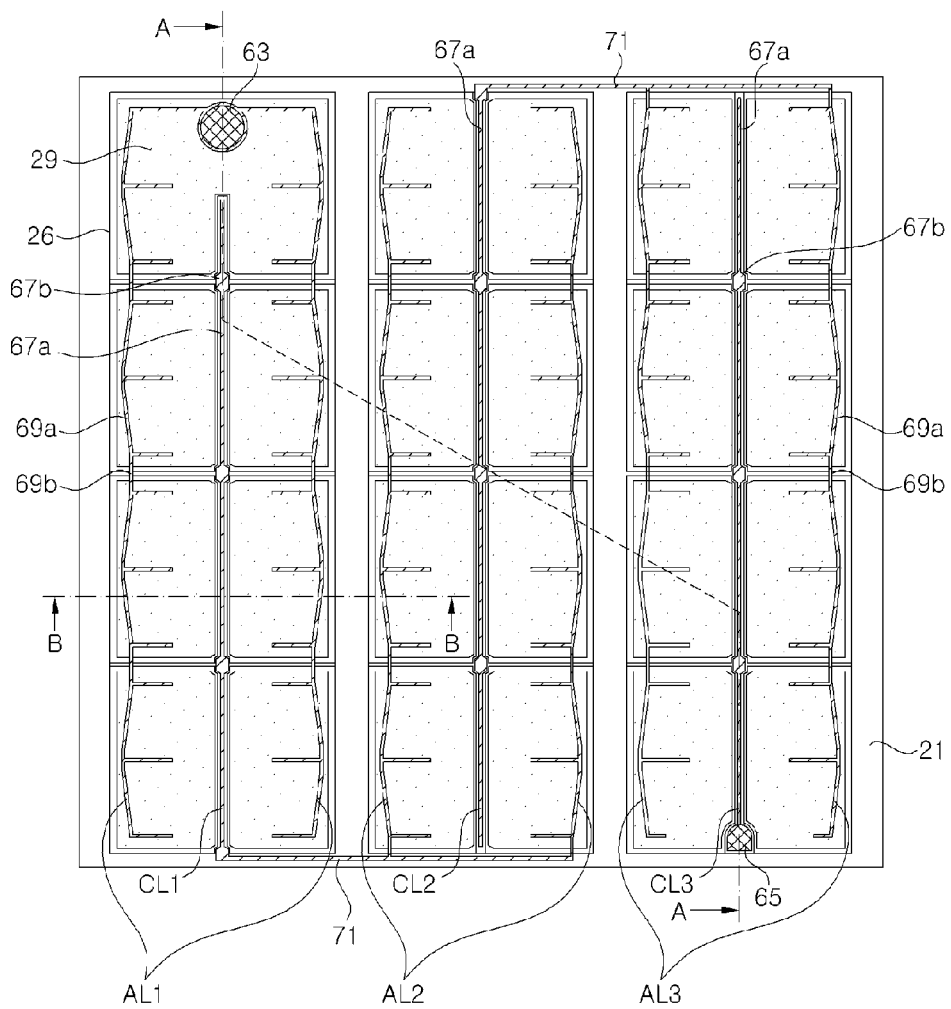
FIG. 15 is a schematic plan view of a light emitting diode in accordance with an exemplary embodiment of the present invention.
Figure 16:
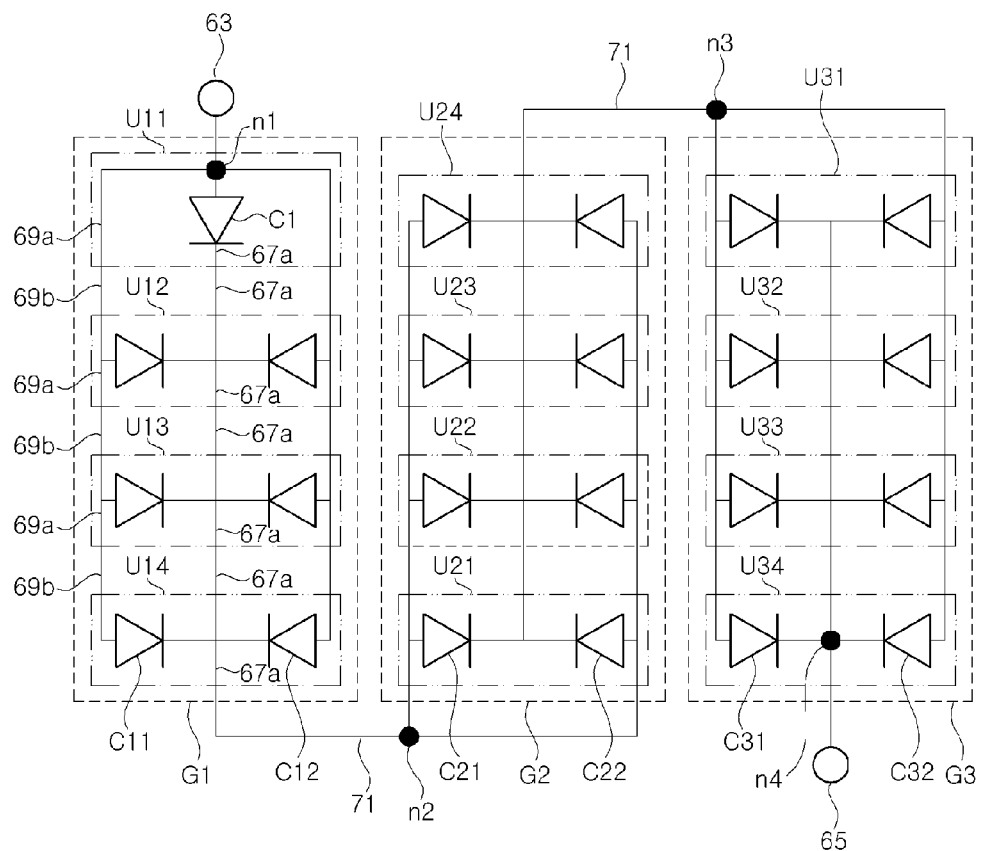
FIG. 16 is a circuit diagram of FIG. 15.
Figure 17A:
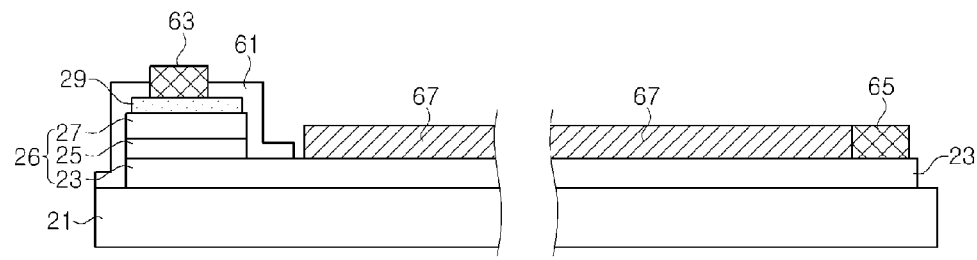
FIG. 17a and FIG. 17b are sectional views taken along lines A-A and B-B of FIG. 15.
Figure 17B:
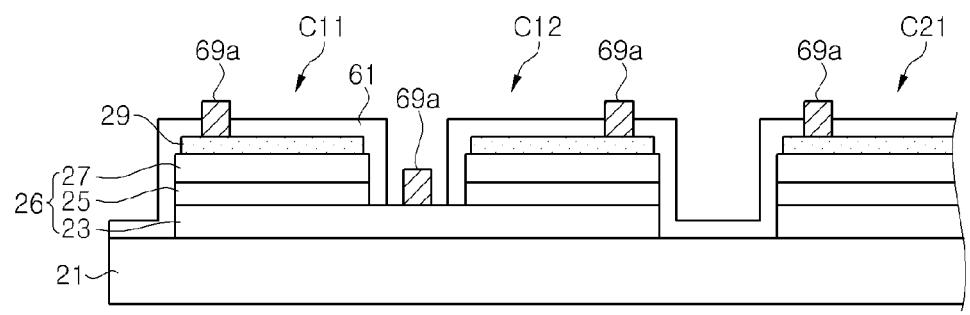

FIG. 15 is a schematic plan view of a light emitting diode in accordance with an exemplary embodiment of the invention, FIG. 16 is a circuit diagram of FIG. 15, and FIG. 17a and FIG. 17b are sectional views taken along lines A-A and B-B of FIG. 15.

Referring to FIG. 15, FIG. 16, FIG. 17a and FIG. 17b, the light emitting diode according to the present exemplary embodiment is generally similar to the light emitting diode described with reference to FIG. 10 and FIG. 11. In the present exemplary embodiment, however, all of light emitting cells 26 in each of groups G1, G2, G3 share a first conductive type semiconductor layer 23.

Specifically, in the above exemplary embodiments, the first conductive type semiconductor layers 23 for the pairs of light emitting cells 26 in each of the groups G1, G2, G3 are separated from each other. On the contrary, in the present exemplary embodiment, all of the light emitting cells 26 connected in parallel to each other in each of the groups G1, G2, G3 are placed on a single first conductive type semiconductor layer 23. For example, in the exemplary embodiment of FIG. 10, U11~U14, U21~U24, and U31~U34 indicate the light emitting cells 26 for the respective first conductive type semiconductor layers 23 separated from each other in each row. On the contrary, in the present exemplary embodiment, U11~U14 indicate pairs of light emitting cells 26 disposed to face each other, instead of the light emitting cells 26 for the respective first conductive type semiconductor layers 23 separated from each other.

According to the present exemplary embodiment, it is possible to provide a simpler patterning process for the first conductive type semiconductor layers 23 and to eliminate the connecting sections 67b. In addition, as the pattern of first conductive type semiconductor layers 23 is simplified, the connecting sections 69b may be formed more easily.

Furthermore, in the light emitting diode described in FIG. 12 to FIG. 14, all of light emitting cells 26 connected in parallel to each other in each group may share the first conductive type semiconductor layer 23.

According to the exemplary embodiments of the present invention, the light emitting diode ensures uniform current spreading in light emitting cells. In addition, the light emitting diode has high reliability by improving light extraction efficiency of each light emitting cell. Further, the light emitting diode permits high integration of plural light emitting cells by arrangement of plural pairs of light emitting cells using common cathodes.

Although the invention has been illustrated with reference to some exemplary embodiments in conjunction with the drawings, it will be apparent to those skilled in the art that various modifications and changes can be made in the invention without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the invention covers the modifications and variations of this invention provided they come within the scope of the appended claims and their equivalents.

What is claimed is:

1. A light-emitting diode, comprising:
   a first group comprising first light emitting cells connected in parallel to each other;
   a second group comprising second light emitting cells connected in parallel to each other;
   a first common electrode line disposed between the first light emitting cells;
   two second electrode lines respectively disposed on and extending across each of the second light emitting cells;

an interconnecting section electrically connecting the first common electrode line and the two second electrode lines; and another two second electrode lines disposed on the first light emitting cells, wherein each first light emitting cell and second light emitting cell comprises a semiconductor stack comprising a first conductivity-type semiconductor layer, a second conductivity-type semiconductor layer, and an active layer disposed between the first conductivity-type semiconductor layer and the second conductivity-type semiconductor layer, wherein the first common electrode line is connected to the first conductivity-type semiconductor layer of each of the first light emitting cells, wherein at least two light emitting cells of the first light emitting cells share the first conductivity-type semiconductor layer, wherein at least two light emitting cells of the second light emitting cells share the first conductivity-type semiconductor layer, and wherein the first group is electrically connected in series to the second group by the interconnecting section.

2. The light-emitting diode of claim 1, wherein
the first group comprises at least one pair of first light emitting cells disposed to face each other with respect to the first common electrode line, the at least one pair of first light emitting cells sharing the first conductivity-type semiconductor layer.

3. The light-emitting diode of claim 2, wherein the first group comprises pairs of first light emitting cells.

4. The light-emitting diode of claim 2, further comprising:
a second common electrode line connected to the first conductivity-type semiconductor layers of the second light emitting cells,
wherein the second group comprises at least one pair of second light emitting cells disposed to face each other with respect to the second common electrode line, the at least one pair of second light emitting cells sharing the first conductivity-type semiconductor layer.

5. The light-emitting diode of claim 4, wherein the second group comprises pairs of second light emitting cells.

6. The light-emitting diode of claim 4, further comprising:
two first electrode lines disposed on opposing sides of the first common electrode line, the two first electrode lines electrically connecting the second conductivity-type semiconductor layers of the first light emitting cells to each other; and
wherein the two second electrode lines are disposed on opposing sides of the second common electrode line, the two second electrode lines electrically connecting the second conductivity-type semiconductor layers of the second light emitting cells to each other.

7. The light-emitting diode of claim 1, wherein the first light emitting cells and the second light emitting cells are disposed on a single substrate.

8. The light-emitting diode of claim 1, wherein the first light emitting cells are connected in parallel to each other between a first node and a second node, the second light emitting cells are connected in parallel to each other between the second node and a third node, and the first light emitting cells are connected in series to the second light emitting cells though the second node.

9. The light-emitting diode of claim 1, further comprising:
a third group comprising third light emitting cells connected in parallel to each other,
wherein at least two light emitting cells of the third light emitting cells share the first conductivity-type semiconductor layer, and the second light emitting cells are connected in series to the third light emitting cells.

10. The light-emitting diode of claim 1, further comprising an electrode pad disposed on the first conductivity-type semiconductor layer of one of the first light emitting cells.

11. The light-emitting diode of claim 10, wherein further comprising an insulation layer disposed between the electrode pad and the first conductivity-type semiconductor layer,
wherein the insulation layer insulates the electrode pad from the first conductivity-type semiconductor layer.

12. The light-emitting diode of claim 11, wherein the insulation layer covers a side surface of the first conductivity-type semiconductor layer.

13. The light-emitting diode of claim 9, wherein:
the second group is disposed between the first and third groups;
the first, second, and third groups are connected in series with each other; and
current is configured to travel through the first and third groups in a first direction and through the second group in a second direction opposite to the first and third groups.

* * * * *